United States Patent [19]
Chan

[11] Patent Number: 5,093,628
[45] Date of Patent: Mar. 3, 1992

[54] CURRENT-PULSE INTEGRATING CIRCUIT AND PHASE-LOCKED LOOP

[75] Inventor: Ivan T. Chan, Kanata, Canada

[73] Assignee: Digital Equipment Corporation of Canada, Ltd., Kanata, Canada

[21] Appl. No.: 485,151

[22] Filed: Feb. 26, 1990

[51] Int. Cl.$^5$ .......................... H03K 5/00; H03K 5/13
[52] U.S. Cl. .................................... 328/127; 328/155; 307/262
[58] Field of Search ..................... 328/127, 128, 155; 307/262; 331/1 A

[56] References Cited

U.S. PATENT DOCUMENTS

| | | | |
|---|---|---|---|
| 3,988,595 | 10/1976 | Eatock | 307/362 |
| 4,114,050 | 9/1978 | Lerche | 328/127 |
| 4,122,528 | 10/1978 | Rieger | 328/127 |
| 4,918,338 | 4/1990 | Wang | 328/127 |

Primary Examiner—Timothy P. Callahan
Attorney, Agent, or Firm—Fish & Richardson

[57] ABSTRACT

Circuitry and method for integrating current pulses, the circuitry including an integration amplifier having an integration capacitor located in its feedback loop. The current pulse integrator also includes three current sources and four current switches. A first current switch is located between the first current source and a second current source. A second current switch is located between the output of the integration amplifier and the second current source. A third current switch has one end connected to the first current source and the input to the integration amplifier, and the other end connected to the third current source. A fourth current switch is connected between the output of the integration amplifier and the third current source. Current passes through the integration capacitor in a first direction to charge the integration capacitor during a charge state of operation of the current pulse integrator. Current is prevented from passing through the integration capacitor in the first direction during at least one other state of operation of the current pulse integrator. An output current from the integration amplifier during the charge state of operation is substantially equal to an output current from the integration amplifier during the other state or states of operation.

13 Claims, 2 Drawing Sheets

CURRENT-PULSE INTEGRATING CIRCUIT AND PHASE-LOCKED LOOP

BACKGROUND OF THE INVENTION

This invention relates to current-pulse integrators that generate voltage signals proportional to the integral of a current over a pulse-width time.

Current-pulse integrators typically include an integration amplifier having an integration capacitor connected between the input and the output of the integration amplifier. A set of current switches cause current to pass through the integration capacitor in one direction when the capacitor is being charged, and cause current to pass through the capacitor in the opposite direction when the capacitor is being discharged. The voltage across the integration capacitor is equal to the product of the current and the charging time, minus the product of the current and the discharging time.

SUMMARY OF THE INVENTION

In one aspect the invention features a current pulse integrator that includes an integration amplifier having an integration capacitor located in its feedback loop. The current pulse integrator also includes switching circuitry, which causes current to pass through the feedback integration capacitor in a first direction during a first state of operation of the current pulse integrator, and which prevents current from passing through the integration capacitor in the first direction during at least one other state of operation of the current pulse integrator. The output current of the integration amplifier remains unchanged as the switching circuitry switches between the first state of operation and the other state or states of operation.

In another aspect of the invention the switching circuitry provides a path through the feedback loop for the output current of the integration amplifier to pass through the integration capacitor during the first state of operation. The switching circuitry also provides an alternative, nonfeedback path for the output current of the integration amplifier during the other state or states of operation.

In preferred embodiments the current pulse integrator includes three current sources, and the switching circuitry includes four current switches. A first current switch is located between a first current source and a second current source. A second current switch is located between the output of the integration amplifier and the second current source. A third current switch has one end connected to the first current source and the input to the integration amplifier, and the other end connected to the third current source. A fourth current switch is connected between the output of the integration amplifier and the third current source.

The second current switch is controlled by a discharge pulse signal, the first current switch is controlled by a signal that is inverse to the discharge signal, the third current switch is controlled by a charge pulse signal, and the fourth current switch is controlled by a signal that is inverse to the charge signal. The current pulse integrator has a charge state, a discharge state, an off state, and an on state of operation. In the charge state the charge signal is high and the discharge signal is low, and current passes through the integration capacitor in a direction from the output of the integration amplifier to the input of the integration amplifier, to charge the integration capacitor. In the discharge state the discharge signal is high and the charge signal is low, and current passes through the integration capacitor in a direction from the input of the integration amplifier to the output of the integration amplifier, to discharge the integration capacitor. In the off state the charge signal and the discharge signal are low, and no current flows through the integration capacitor. In the on state the charge signal and the discharge signal are high, and no current flows through the integration capacitor.

During the charge state current flows from the first current source through the first current switch to the second current source, and current flows from the output of the integration amplifier through the integration capacitor and through the third current switch to the third current source. During the discharge state current flows from the first current source through the integration capacitor and through the second and fourth current switches to the second and third current sources, and current flows from the output of the integration amplifier through the second and fourth current switches to the second and third current sources. During the off state current flows from the first current source through the first current switch to the second current source, and current flows from the output of the integration amplifier through the fourth current switch to the third current source. During the on state current flows from the first current source through the third current switch to the third current source, and current flows from the output of the integration amplifier through the second current switch to the second current source.

Current pulse integrators according to the invention have an integration amplifier whose output current remains unchanged as the switching circuitry switches between the various states of operation of the circuit. Thus, as the state of operation of the current pulse integrator changes, there is no delay in current passing through the integration capacitor due to the integration amplifier adjusting its output current. The integrator circuit can therefore exhibit a high degree of accuracy, even where changes between the various states of operation occur frequently.

Current pulse integrators according to the invention can be used in such applications as a high-speed phase-locked loop. A phase detector produces the charge and discharge pulse signals, which are received by the current pulse integrator. A voltage-controlled oscillator produces a feedback signal having a frequency of oscillation that is proportional to the charge across the integration capacitor of the current-pulse integrator. The feedback signal is received by the phase detector.

Other advantages and features will become apparent from the following detailed description and from the claims when read in connection with the accompanying drawings.

DESCRIPTION OF THE PREFERRED EMBODIMENTS

We first briefly describe the drawings.

DRAWINGS

Figure 2:
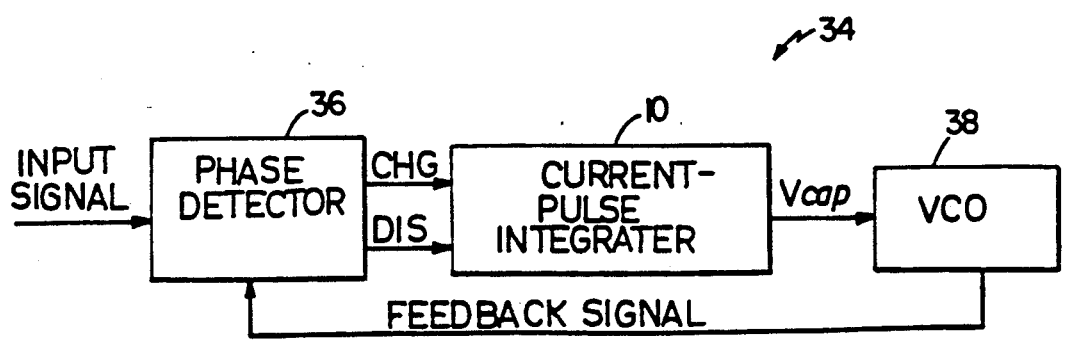
FIG. 2 is a block diagram of a phase-locked loop circuit that utilizes a current pulse integrator according to the invention.
Figure 3A:
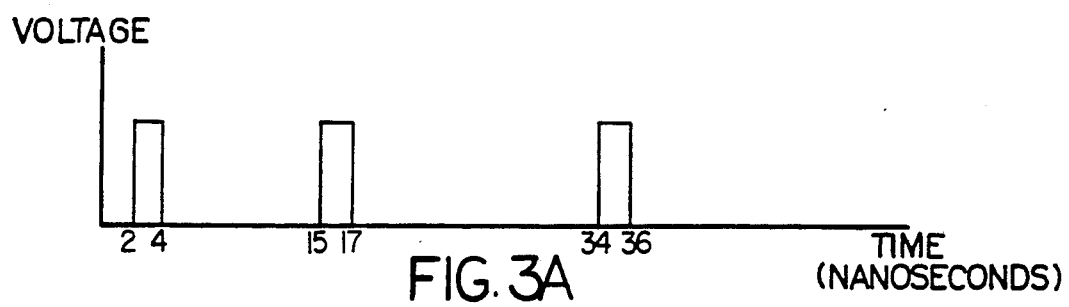
Figure 3B:
Figure 3C:
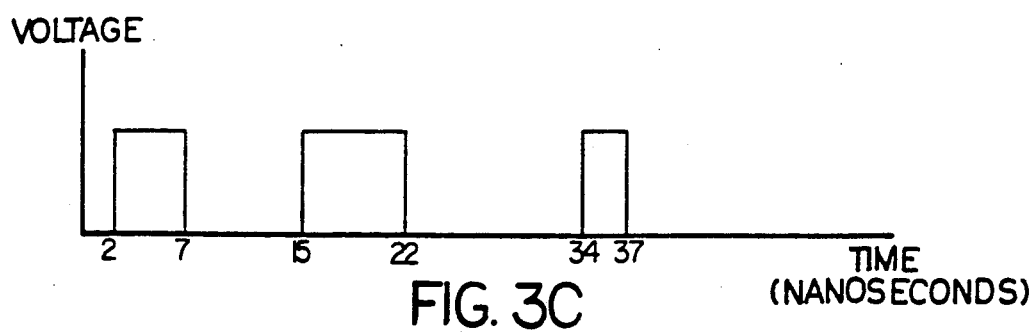

FIGS. 3A, 3B, and 3C are pulse diagrams of input pulses to the phase-locked loop circuit of FIG. 2, DISCHARGE pulses produced by the phase-locked loop circuit, and CHARGE pulses produced by the phase-locked loop circuit, respectively.

STRUCTURE AND OPERATION

Figure 1:
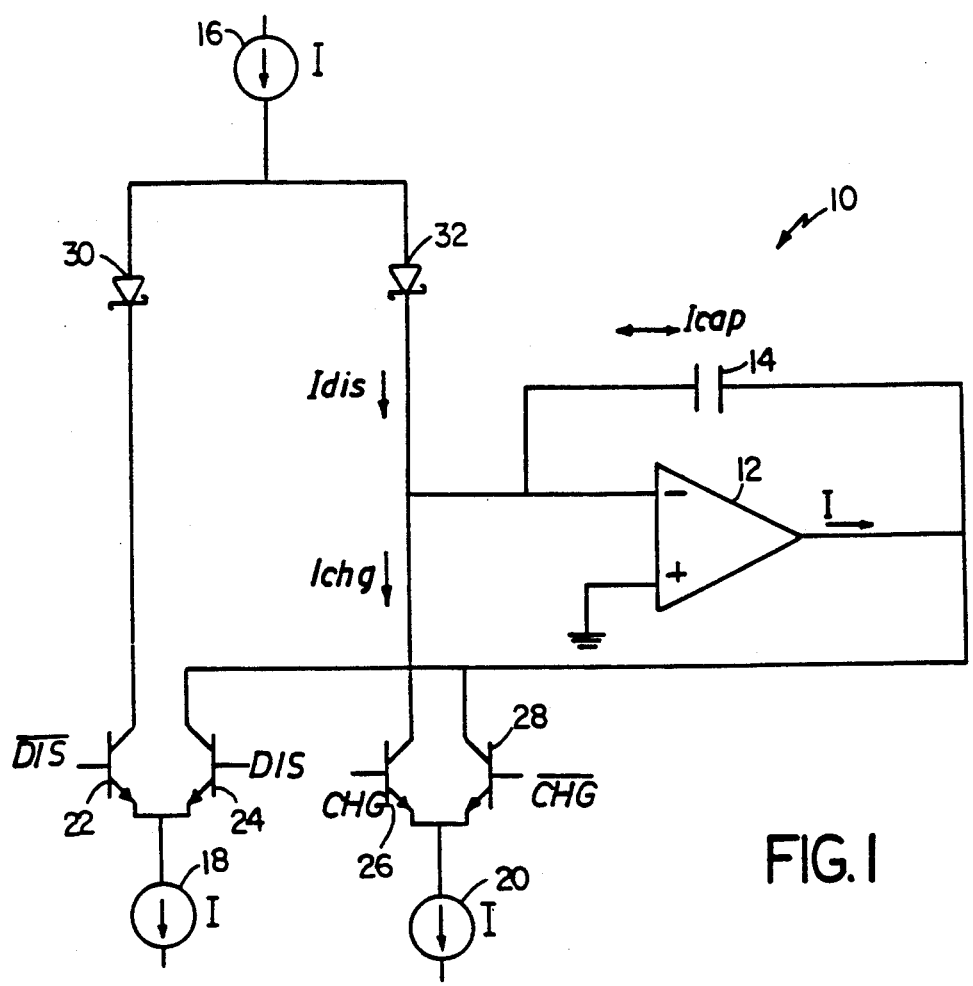
FIG. 1 is a circuit diagram of a current pulse integrator according to the invention.

As shown in FIG. 1, a high-speed current-pulse integrator circuit 10 according to the invention has an integration amplifier 12 and an integration capacitor 14 located in the feedback loop of the integration amplifier 12. As explained below, the voltage across the integration capacitor is the integral of a current over a set of CHARGE pulse widths, minus the integral of the current over a set of DISCHARGE pulse widths.

The current through the integration capacitor is controlled by three current sources 16, 18, and 20, and by switching circuitry that includes four high-speed current switches 22, 24, 26, and 28, which may be npn transistors, and two high-speed Schottky diodes 30 and 32. Diode 30 connects current source 16 with current switch 22, which is connected to current source 18. Diode 32 connects current source 16 with the inverting input of integration amplifier 12 and also with current switch 26, which is connected to current source 20. Current switch 24 connects the output of integration amplifier 12 with current source 18. Current switch 28 connects the output of integration amplifier 12 with current source 20. The four current switches 22, 24, 26, and 28 are regulated by pulse signals $\overline{\text{DIS}}$, DIS, CHG, and $\overline{\text{CHG}}$ respectively.

The circuit has four states of operation: OFF, DISCHARGE, CHARGE, and ON. During the CHARGE state of operation a current of magnitude I flows through the integration capacitor 14 to the left in FIG. 1. During the DISCHARGE state of operation current of magnitude I flows through the integration capacitor to the right in FIG. 1. During the OFF and ON states of operation no current flows through the integration capacitor.

To place the circuit in the OFF state of operation, the CHG and DIS pulse signals are set low, while the $\overline{\text{CHG}}$ and $\overline{\text{DIS}}$ pulse signals are set high, causing current switches 22 and 28 to turn on and current switches 24 and 26 to turn off. Current of magnitude I flows from current source 16, through diode 30 and current switch 22, to current source 18. Current source 20 pulls a current of magnitude I out of the output of integration amplifier 12 and through current switch 28. No current flows through integration capacitor 14.

To place the circuit in the DISCHARGE state of operation, the CHG and $\overline{\text{DIS}}$ pulse signals are set low, while the $\overline{\text{CHG}}$ and DIS pulse signals are set high, causing current switches 24 and 28 to turn on and current switches 22 and 26 to turn off. Current of magnitude I flows from current source 16, through diode 32 and capacitor 14, through current switches 24 and 28, to current sources 18 and 20. A current of magnitude I flows out of the output of integration amplifier 12, through current switches 24 and 28, to current sources 18 and 20.

To place the circuit in the CHARGE state of operation, the $\overline{\text{CHG}}$ and DIS pulse signals are set low, while the CHG and $\overline{\text{DIS}}$ pulse signals are set high, causing current switches 22 and 26 to turn on and current switches 24 and 28 to turn off. Current of magnitude I flows from current source 16, through diode 30 and current switch 22, to current source 18. Current source 20 pulls a current of magnitude I out of the output of integration amplifier 12 and through capacitor 14 and current switch 26.

To place the circuit in the ON state of operation, the $\overline{\text{CHG}}$ and $\overline{\text{DIS}}$ pulse signals are set low, while the CHG and DIS pulse signals are set high, causing current switches 24 and 26 to turn on and current switches 22 and 28 to turn off. Current of magnitude I flows from current source 16, through diode 32 and current switch 26, to current source 20. Current source 18 pulls a current of magnitude I out of the output of integration amplifier 12 and through current switch 24. No current flows through integration capacitor 14.

The integration amplifier 12 requires a certain settling time for the output current of the integration amplifier to settle from an original value to within a specified percentage of a final value. Yet, the output current of the integration amplifier 12 remains a constant current of magnitude I regardless of the state of operation of the circuit. Thus, as the circuit switches to the CHARGE or DISCHARGE state of operation, current of magnitude I immediately passes through the capacitor 14 in the appropriate direction, without any delay due to the integration amplifier 12 adjusting its output current. The accuracy of integration is thereby improved, especially where changes between the CHARGE state and the DISCHARGE state of operation occur frequently.

The current switches 22, 24, 26, and 28 and the Schottky diodes 30 and 32 have a fast response time. The integration amplifier 12 can slew its output voltage to track the changing voltage of the integration capacitor 14 as fast as the bandwidth limitation of the integration amplifier 12 allows. Although the frequency response time (the speed) of the integration amplifier is limited by the bandwidth limitation, the deterioration in current passing through the integration capacitor 14 due to the limited frequency response time of the integration amplifier 12 is minimal.

FIG. 2 shows a phase-locked loop circuit 34 that utilizes a current-pulse integrator 10 according to the invention. A phase detector 36 receives an input signal pulse train, shown in FIG. 3A, and a feedback signal pulse train. Phase detector 36 produces a train of DISCHARGE pulses, shown in FIG. 3B, that rise and fall in synchronization with the feedback signal. Phase detector 36 also produces a train of CHARGE pulses, shown in FIG. 3C, that rise in synchronization with the rising of the input signal pulses shown in FIG. 3A, and that fall in synchronization with the falling of the DISCHARGE pulses shown in FIG. 3B. Thus, when the input signal lags behind the feedback signal, the CHARGE pulses of FIG. 3C are narrower than the DISCHARGE pulses of FIG. 3B. When the input signal leads the feedback signal, the CHARGE pulses of FIG. 3C are wider than the DISCHARGE pulses of FIG. 3B.

The current pulse integrator 10 produces a voltage $V_{cap}$ across its integration capacitor that is proportional to the integral of current I over the durations of the CHG pulse signals, minus the integral of current I over the durations of the DIS pulse signals. A voltage-controlled oscillator 38 receives the voltage across the integration capacitor and produces the feedback signal with a frequency of oscillation that is proportional to the voltage across the integration capacitor. The feedback signal locks onto the frequency of the input signal.

Other embodiments are within the following claims.

I claim:

1. A current pulse integrator comprising
an integration amplifier having an input, an output, and a feedback loop,
an integration capacitor located in the feedback loop of the integration amplifier, and
switching circuitry for causing current to pass through the integration capacitor in a first direction during a first state of operation of the current pulse integrator, and for preventing current from passing through the integration capacitor in the first direction during at least one other state of operation of the current pulse integrator,
the switching circuitry being arranged to provide a circuit path for an output current of the integration amplifier during the first state of operation and during the at least one other state of operation so that the output current of the integration amplifier remains unchanged as the switching circuitry switches between the first state of operation and the at least one other state of operation.

2. A current pulse integrator, comprising
an integration amplifier having an input, an output, and a feedback loop,
an integration capacitor located in the feedback loop of the integration amplifier, and
switching circuitry for providing a path through the feedback loop for an output current of the integration amplifier to pass through the integration capacitor in a first direction during a first state of operation of the current pulse integrator, and for providing an alternate, nonfeedback path for the output current of the integration amplifier during at least one other state of operation of current pulse integrator the path through the feedback loop and the alternate, nonfeedback path being arranged so that the output current of the integration amplifier remains unchanged as the switching circuitry switches between the first state of operation and the at least one other state of operation.

3. The current pulse integrator of claim 1 or 2, wherein
the at least one other state of operation of the current pulse integrator comprises a second state of operation in which current passes through the integration capacitor in a second direction opposite to the first direction.

4. The current pulse integrator of claim 3, wherein
the at least one other state of operation of the current pulse integrator further comprises at least a third state of operation in which no current passes through the integration capacitor.

5. A current pulse integrator comprising
an integration amplifier having an input, an output, and a feedback loop between the input and the output,
an integration capacitor located in the feedback loop of the integration amplifier,
first, second and third current sources,
a first current switch located between the first current source and the second current source,
a second current switch located between the output of the integration amplifier and the second current source,
a third current switch having a first end connected to the first current source and the input of the integration amplifier, and a second end connected to the third current source, and a fourth current switch connected between the output of the integration amplifier and the third current source,
the first, second, third, and fourth current switches being controlled by control signals for selectively activating the first, second, third, and fourth current switches to control charging and discharging of the integration capacitor.

6. The current pulse integrator of claim 5 wherein
the control signal for controlling the second current switch is a discharge signal,
the control signal for controlling the first current switch is a signal that is inverse to the discharge signal,
the control signal for controlling the third current switch is a charge signal, and
the control signal for controlling the fourth current switch is a signal that is inverse to the charge signal.

7. The current pulse integrator of claim 6 wherein there are a plurality of states of operation of the current pulse integrator comprising
a charge state in which the charge signal is high and the discharge signal is low, and current passes through the integration capacitor in a direction from the output of the integration amplifier to the input of the integration amplifier, to charge the integration capacitor,
a discharge state in which the discharge signal is high and the charge signal is low, and current passes through the integration capacitor in a direction from the input of the integration amplifier to the output of the integration amplifier, to discharge the integration capacitor.

8. The current pulse integrator of claim 7 wherein the plurality of states of operation of the current pulse integrator further comprise
an off state in which the charge signal and the discharge signal are low, and no current flows through the integration capacitor, and
an on state in which the charge signal and the discharge signal are high, and no current flows through the integration capacitor.

9. The current pulse integrator of claim 8 further comprising
a first diode connected between the first current source and the first current switch, and
a second diode connected between the first current source and the input to the integration amplifier.

10. The current pulse integrator of claim 9, wherein
during the charge state current flows from the first current source through the first diode to the first current switch, and current flows from the output of the integration amplifier through the integration capacitor to the third current switch,
during the discharge state current flows from the first current source through the second diode and through the integration capacitor to the second and fourth current switches, and current flows from the output of the integration amplifier to the second and fourth current switches,
during the off state current flows from the first current source through the first diode to the first current switch, and current flows from the output of the integration amplifier to the fourth current switch, and
during the on state current flows from the first current source through the second diode to the third current switch, and current flows from the output of the integration amplifier to the second current switch.

11. A phase-locked loop circuit comprising
a phase detector that produces pulses of a duration having a predetermined relationship to a phase difference between an input signal and a feedback signal,
a current pulse integrator that produces a voltage across an integration capacitor that is proportional to an integral of a current over said durations of said pulses produced by said phase detector, and
a voltage-controlled oscillator that produces said feedback signal with a frequency of oscillation that has a predetermined relationship to said voltage across said integration capacitor,
said current pulse integrator comprising
an integration amplifier having an input, an output, and a feedback loop,
an integration capacitor located in the feedback loop of the integration amplifier, and
switching circuitry for causing current to pass through the integration capacitor in a first direction during a first state of operation of the current pulse integrator, and for preventing current from passing through the integration capacitor in the first direction during at least one other state of operation of the current pulse integrator,
the switching circuitry being arranged to provide a circuit path for an output current of the integration amplifier during the first state of operation and during the at least one other state of operation so that the output current of the integration amplifier remains unchanged as the switching circuitry switches between the first state of operation and the at least one other state of operation.

12. A method of integrating current pulses, comprising the steps of
during a charge state of operation, routing current from a first current source through a first current switch to a second current source, and routing current from an output of an integration amplifier through a feedback integration capacitor in a first direction and through a third current switch to a third current source, and
during a discharge state of operation, routing current from the first current source through the integration capacitor in a second direction opposite to the first direction and through second and fourth current switches to the second and third current sources respectively.

13. The method of claim 12 further comprising the steps of
during an off state of operation, routing current from the first current source through the first current switch to the second current source, and routing current from the output of the integration amplifier through the fourth current switch to the third current source, and during an on state of operation, routing current from the first current source through the third current switch to the third current source, and routing current from the output of the integration amplifier through the second current switch to the second current source.

* * * * *

UNITED STATES PATENT AND TRADEMARK OFFICE
CERTIFICATE OF CORRECTION

PATENT NO.    : 5,093,628

DATED         : March 3, 1992

INVENTOR(S)   : Ivan T. Chan

It is certified that error appears in the above-identified patent and that said Letters Patent is hereby corrected as shown below:

Title page, item (56):
References Cited

Add the following U.S. PATENT DOCUMENTS:

```
--4,074,205  2/1978   Robe              330/257--
--4,228,366  10/1980  Huttemann et al.  307/229--
--4,374,335  2/1983   Fukahori et al.   307/521--
--4,550,295  10/1985  Sasaki            330/109--
--4,734,598  3/1988   Bohme             307/491--
--4,746,871  5/1988   de la Plaza       328/127--
```

Signed and Sealed this

Twenty-eighth Day of September, 1993

*Attest:*

BRUCE LEHMAN

*Attesting Officer*    Commissioner of Patents and Trademarks